(12) United States Patent
Keith et al.

(10) Patent No.: US 7,531,783 B2
(45) Date of Patent: May 12, 2009

(54) VARIABLE GAIN CONSTANT BANDWIDTH TRANS-IMPEDANCE AMPLIFIER FOR FIBER OPTIC RATE SENSOR

(75) Inventors: Gregory W. Keith, Glendale, AZ (US); Chung-Jen Chen, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/764,031

(22) Filed: Jun. 15, 2007

(65) Prior Publication Data
US 2008/0308713 A1 Dec. 18, 2008

(51) Int. Cl.
*H03F 3/08* (2006.01)
(52) U.S. Cl. ............... 250/214 A; 250/214 DC; 330/136
(58) Field of Classification Search .......... 250/208.1, 250/214 DC, 214 AG, 214 G, 214 A; 330/136
See application file for complete search history.

(56) References Cited

U.S. PATENT DOCUMENTS

| | | | |
|---|---|---|---|
| 5,812,030 A | 9/1998 | Inami et al. | |
| 6,215,116 B1 * | 4/2001 | Van Marcke | 250/221 |
| 6,303,922 B1 | 10/2001 | Kasper | |
| 7,378,881 B1 * | 5/2008 | Opris | 327/52 |

OTHER PUBLICATIONS

Makoto Nakamura, et al.; 1.25-Gb/s Burst-Mode Receiver ICs With Quick Response for PON Systems; NTT Photonics Laboratories; Mar. 31, 2005, revised Jul. 22, 2005.

* cited by examiner

*Primary Examiner*—Thanh X Luu
*Assistant Examiner*—Francis M LeGasse, Jr.
(74) *Attorney, Agent, or Firm*—Black Lowe & Graham

(57) ABSTRACT

A trans-impedance amplifier with gain control for a fiber optic rotation rate sensor. A variable gain amplifier having gain control based on keeping the amplifier output above a certain level. The gain control approach allows the amplifier bandwidth to remain constant. A gain control circuit includes a control device connected to ground and the amplifier feedback network. The input to the gain control circuit may be the amplifier output that has been filtered, or the input could be from an external circuit or microcontroller.

7 Claims, 6 Drawing Sheets

VARIABLE GAIN CONSTANT BANDWIDTH TRANS-IMPEDANCE AMPLIFIER FOR FIBER OPTIC RATE SENSOR

BACKGROUND OF THE INVENTION

Typically trans-impedance amplifiers with fixed gain are used in an interferometric fiber-optic gyro (IFOG) system. The fixed gain trans-impedance amplifier is calibrated to maximize voltage out based on power measured at a photodiode. The amplifier bandwidth is also calibrated when the gain is calibrated. The amplifier bandwidth and gain would remain constant over the life of the system. This works well in an IFOG system that experiences very little environmental change. However, during radiation exposure, the optical fiber in the IFOG system darkens and signal strength at the photodiode drops significantly. The fixed gain trans-impedance amplifier provides degraded gyro bias performance until the fiber recovers. Also, degraded gyro bias performance of the fixed gain trans-impedance amplifier can occur due to optical losses increasing over time due to component aging.

Also, it is more costly to use fixed gain trans-impedance amplifiers because they require calibration during assembly, and it would require one to stock a large number of different calibration parts.

Previous variable gain approaches degrade the amplifier bandwidth and would adversely affect the gyro bias performance. See FIGS. 1-3.

Therefore, there exists a need for a variable gain trans-impedance amplifier that can effectively respond to radiation events, unit to unit loss variation, and optical loss associated with end of life, without significantly degrading the amplifier bandwidth.

SUMMARY OF THE INVENTION

The present invention provides a variable gain amplifier system and method. An example system includes an amplifier having an input and output and a control device that increases the output of the amplifier if the input of the amplifier drives the output below a first threshold value.

In one aspect of the invention, the amplifier is connected to a photodiode. The control device includes a capacitor and a first resistor connected to the input of the amplifier, a second resistor connected to the capacitor and the first resistor and to the output of the first amplifier, a third resistor connected to the capacitor and the first and second resistors, a switch connected between the third resistor and a biased voltage, and a controller that controls the switch based on the output of the amplifier.

In another aspect of the invention, the switch is a field effect transistor and the controller is an integrator.

In yet another aspect of the invention, the switch is a field effect transistor and the controller is a digital signal from the fiber-optic gyro system.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

Figure 1:
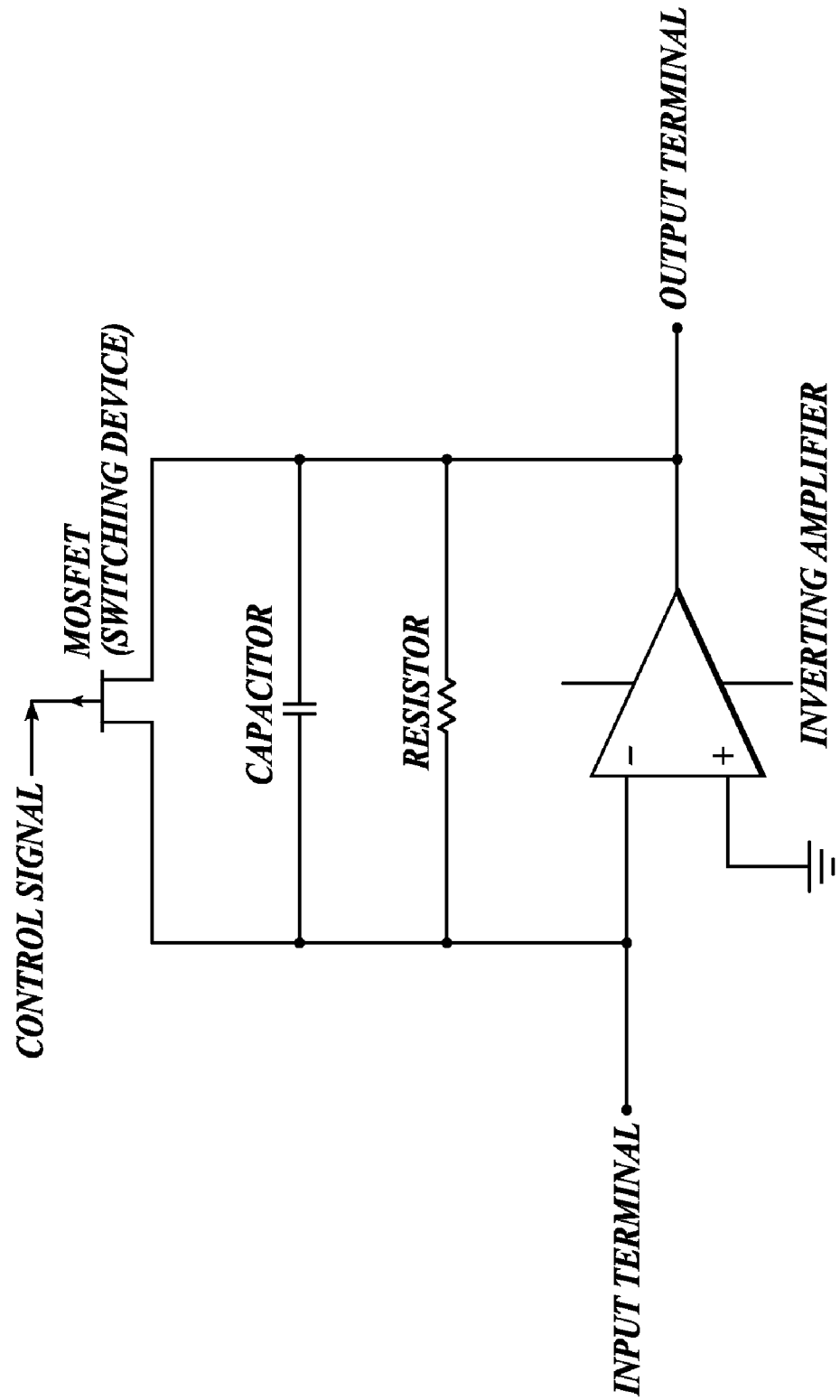
FIGS. 1-3 are prior art amplifiers.
Figure 2:
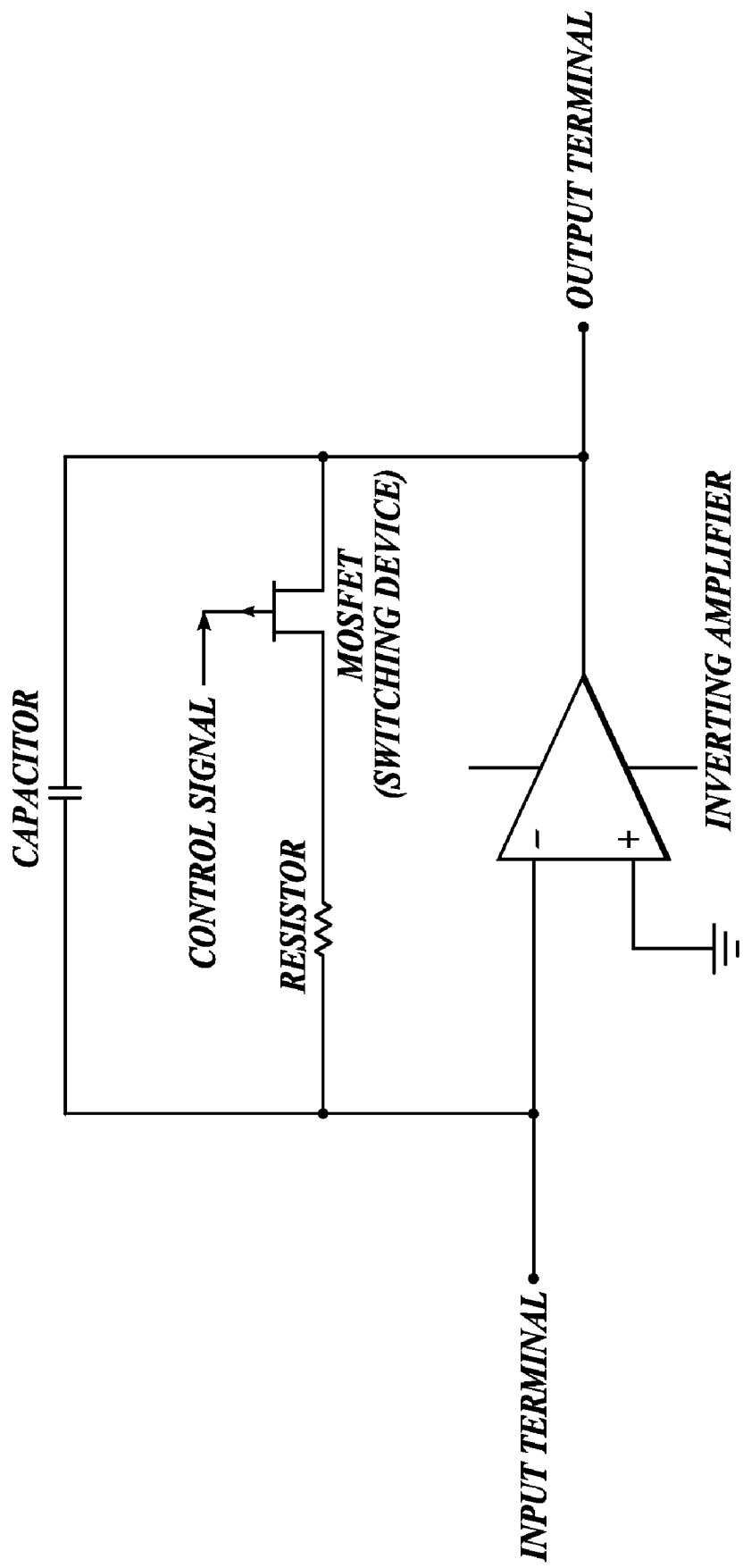
Figure 3:
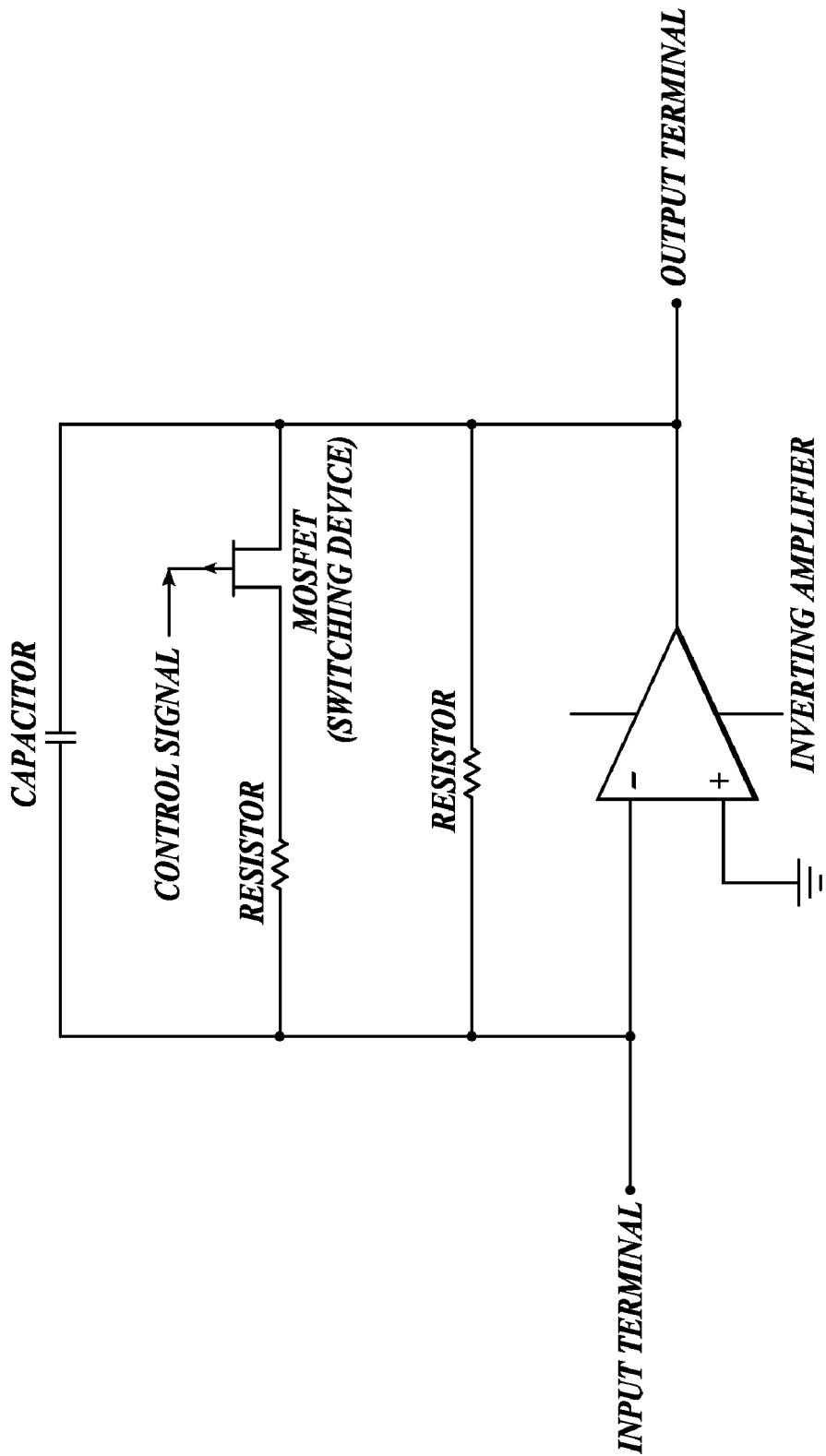
Figure 4:
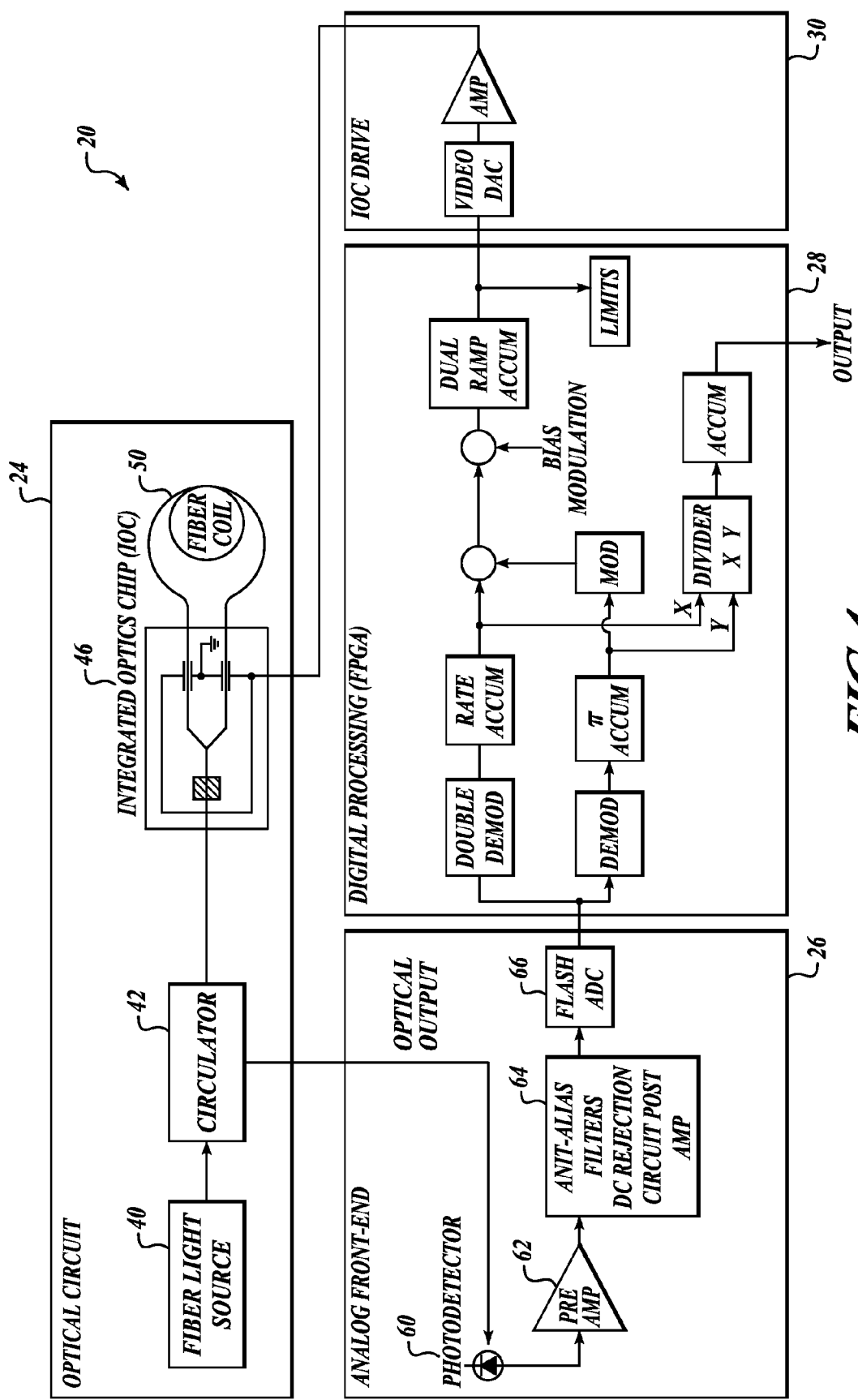
FIG. 4 illustrates a diagram of an example of IFOG system formed in accordance with the embodiment of the present invention.

FIG. 4 illustrates a partial diagram of an interferometric fiber-optic gyro (IFOG) system 20 formed in accordance with an embodiment of the present invention. The system 20 includes an optical circuit 24, an analog front-end circuit component 26, a digital processing component 28 and a drive component 30. The analog front and circuit component 26 is designed to handle low optical output conditions after the optical circuit component 24 has experienced a non-sensing related event. A non-sensing related event is an event that is not associated with the variable that the system 20 is designed to sense. For example, because the system 20 is a gyro, a non-sensing event may be a radiation event. After a radiation event has occurred, the analog front-end component 26 automatically adjusts itself in order to diminish the effects of the radiation event on the system 20.

The optical circuit 24 includes a light source 40, circulator 42, an integrated optics chip (IOC) 46 and a fiber-optic coil 50. The light source 40 generates light that is sent through the circulator 42, the IOC 46, to the fiber-optic coil 50. A light signal is returned from the fiber-optic coil 50 through the IOC 46, and is separated at the circulator 42 for delivering an optical output to the analog front-end circuit component 26.

The analog front-end circuit component 26 includes a photo detector 60, such as a photodiode, that receives the optical output of the circulator 42. The photo detector 60 produces a current dependent upon the quantity of light received from the circulator 42. A variable gain trans-impedance amplifier 62 converts that current from the photo detector 60 to an output voltage that is supplied to a post amplifier 64 then to an analog-to-digital converter (ADC) 66. The output of the ADC 66 is sent to components within the digital processing component 28. The digital processing component 28 in one embodiment is a field-programmable gate array (FPGA). When the output from the circulator 42 is a low light output due to an event, such as a prompt dose radiation event, the variable gain trans-impedance amplifier 62 identifies this event and increases its gain in order to produce a more consistent output.

Figure 5A:
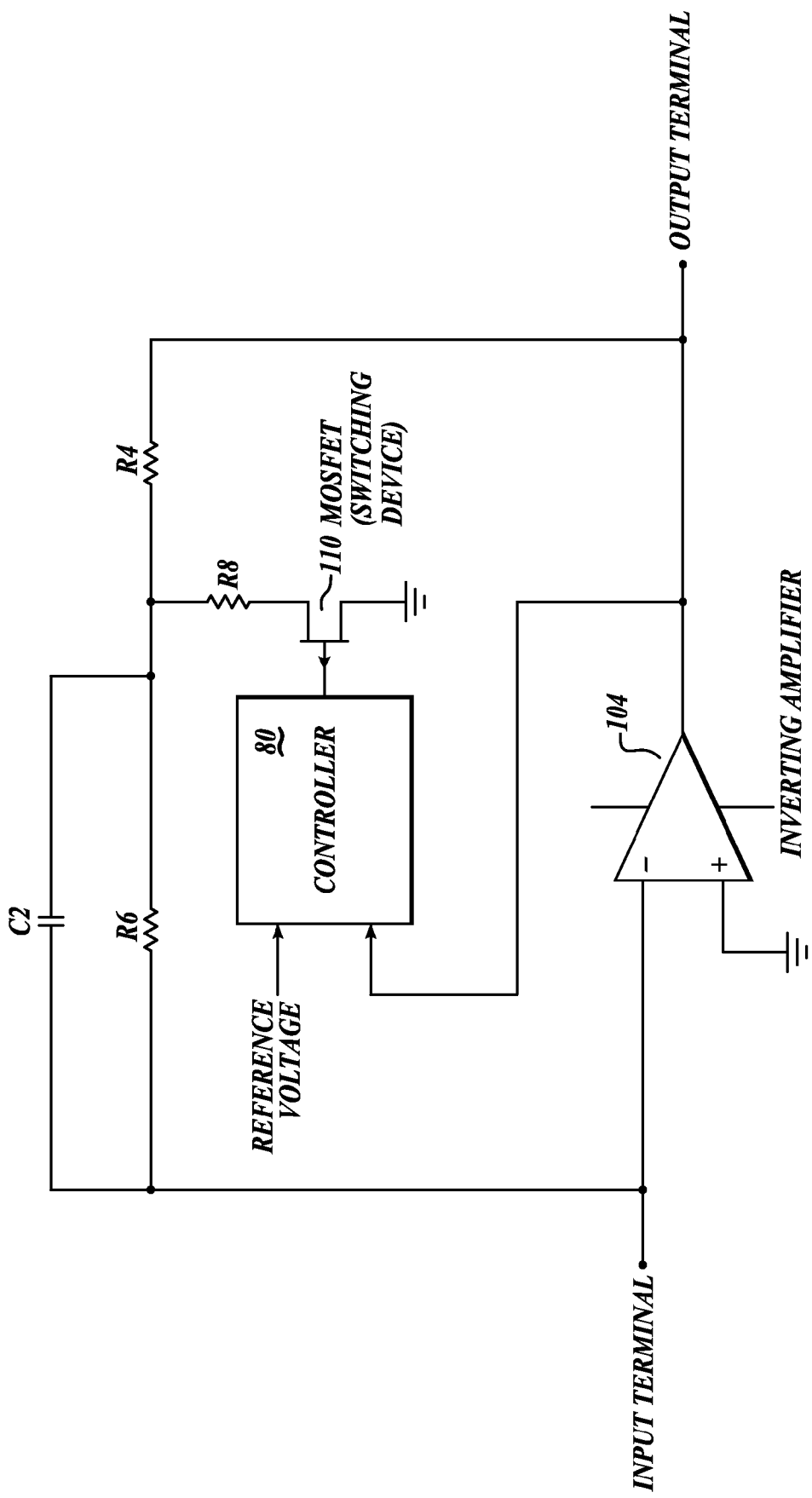
FIGS. 5A and B illustrate a circuit diagram for an embodiment of a variable gain trans-impedance amplifier formed in accordance with an embodiment of the present invention.
Figure 5B:
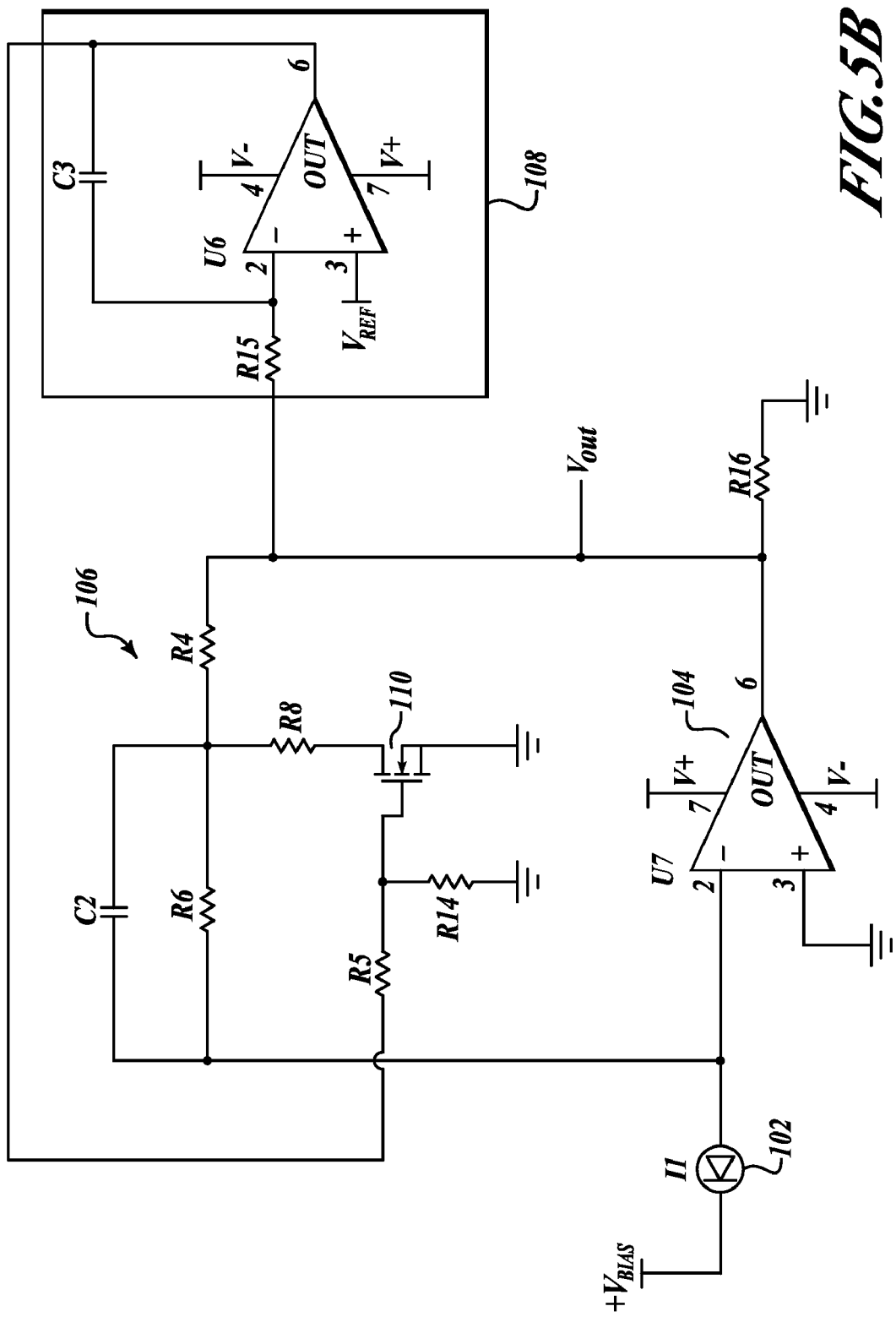

FIGS. 5A and B illustrates an example of a variable gain trans-impedance amplifier 100 and photodiode 102 for use in the analog front end circuit component 26. The variable gain trans-impedance amplifier 100 includes a first amplifier 104 that connects to an anode of the photodiode 102 at the amplifier's inverting Pin 2. The cathode of the photodiode 102 is connected to a positive voltage bias (+$V_{BIAS}$). Also connected to Pin 2 of the amplifier 104 are first sides of a resistor R6 and a capacitor C2. The second sides of the capacitor C2 and the resistor R6 are connected to a first side of a resistor R4 and a resistor R8. The second side of the resistor R4 is connected to the output pin (Pin 6) of the amplifier 104. Pin 6 is the output voltage ($V_{out}$). $V_{out}$ is connected to a controller 80. The controller 80 receives a reference voltage and controls operation of a switch 110. $V_{out}$ is connected to ground through resistor R16.

In one embodiment, the controller 80 includes a resistor R15 and an integrator 108. The resistor R15 is connected to the inverting pin (Pin 2) of the integrator 108 and to a first side of a capacitor C3. A second side of the capacitor C3 and the output pin 6 of the integrator 108 are connected to a gate of a field effect transistor (FET) switch 110 via a resistor R5. The gate of the FET switch 110 is also connected to a bias voltage (e.g., ground) through a resistor R14. The FET switch 110 has its drain connected to a second side of the resistor R8 and its source connected to a bias Voltage (e.g., ground).

The integrator 108 determines when $V_{out}$ drops below a reference value ($V_{ref}$ at Pin 3), which might be due to a darkening of the fiber optic coil 50 due to a radiation event, such as a prompt dose radiation event. When the $V_{out}$ drops below $V_{ref}$, the FET switch 110 is activated to conduct between the Drain and Source, thereby increasing the gain of the amplifier 100. When $V_{out}$ increases back above acceptable levels, then the transistor 110 is deactivated, going back to normal operation.

While the preferred embodiment of the invention has been illustrated and described, as noted above, many changes can be made without departing from the spirit and scope of the invention. For example, other switching devices may be used, such as Bipolar Junction Transistor, to replace the FET switch 110. Accordingly, the scope of the invention is not limited by the disclosure of the preferred embodiment. Instead, the invention should be determined entirely by reference to the claims that follow.

The invention claimed is:

1. A variable gain amplifier system comprising:
   an amplifier having an input and output; and
   a control device for increasing the output of the amplifier if the input of the
   amplifier drives the output below a first threshold value; and
   a means configured to keep the amplifier closed loop bandwidth constant over a predefined range of amplifier gain;
   wherein the control device comprises:
   a capacitor and a first resistor connected to the input of the amplifier;
   a second resistor connected to the capacitor and the first resistor and to the output of the amplifier;
   a third resistor connected to the capacitor and the first and second resistors;
   a switch connected between the third resistor and a biased voltage; and
   a controller configured to receive the output of the amplifier and control the switch based on the received output and a reference voltage.

2. The system of claim 1, wherein the control device decreases the output of the amplifier if the input of the amplifier drives the output above a second threshold value.

3. The system of claim 1, wherein the input of the amplifier is connected to a photodiode.

4. The system of claim 1, wherein the controller includes an integrator.

5. The system of claim 1, wherein the first resistor is larger than the second resistor by at least a factor of 2.

6. The system of claim 1, wherein the photodiode is in optical communication with an interferometric fiber-optic gyro (IFOG).

7. The system of claim 1, wherein the switch is a field effect transistor.

* * * * *